(12) United States Patent
Farnworth

(10) Patent No.: US 6,524,346 B1
(45) Date of Patent: Feb. 25, 2003

(54) STEREOLITHOGRAPHIC METHOD FOR APPLYING MATERIALS TO ELECTRONIC COMPONENT SUBSTRATES AND RESULTING STRUCTURES

(75) Inventor: Warren M. Farnworth, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/259,143

(22) Filed: Feb. 26, 1999

(51) Int. Cl.[7] .................. H01L 21/31; H01L 21/469
(52) U.S. Cl. .................. 634/763; 438/758; 438/795
(58) Field of Search .................. 438/763, 795, 438/758; 264/401, 430

(56) References Cited

U.S. PATENT DOCUMENTS

| | | |
|---|---|---|
| 4,996,010 A | 2/1991 | Modrek |
| 4,999,143 A | 3/1991 | Hull et al. |
| 5,015,424 A | 5/1991 | Smalley |
| 5,058,988 A | 10/1991 | Spence |
| 5,059,021 A | 10/1991 | Spence et al. |
| 5,059,359 A | 10/1991 | Hull et al. |
| 5,071,337 A | 12/1991 | Heller et al. |
| 5,096,530 A | 3/1992 | Cohen |
| 5,104,592 A | 4/1992 | Hull et al. |
| 5,123,734 A | 6/1992 | Spence et al. |
| 5,130,064 A | 7/1992 | Smalley et al. |
| 5,133,987 A | 7/1992 | Spence et al. |
| 5,141,680 A | 8/1992 | Almquist et al. |
| 5,143,663 A | 9/1992 | Leyden et al. |
| 5,164,128 A | 11/1992 | Modrek et al. |
| 5,173,220 A | 12/1992 | Reiff et al. |
| 5,174,931 A | 12/1992 | Almquist et al. |
| 5,182,055 A | 1/1993 | Allison et al. |
| 5,182,056 A | 1/1993 | Spence et al. |
| 5,182,715 A | 1/1993 | Vorgitch et al. |
| 5,184,307 A | 2/1993 | Hull et al. |
| 5,192,469 A | 3/1993 | Smalley et al. |
| 5,192,559 A | 3/1993 | Hull et al. |
| 5,209,878 A | 5/1993 | Smalley et al. |
| 5,234,636 A | 8/1993 | Hull et al. |
| 5,238,639 A | 8/1993 | Vinson et al. |
| 5,248,456 A | 9/1993 | Evans, Jr. et al. |
| 5,256,340 A | 10/1993 | Allison et al. |
| 5,264,061 A | 11/1993 | Juskey et al. |
| 5,267,013 A | 11/1993 | Spence |
| 5,278,442 A * | 1/1994 | Prinz et al. .......... 257/417 |
| 5,321,622 A | 6/1994 | Snead et al. |
| 5,345,391 A | 9/1994 | Hull et al. |
| 5,358,673 A | 10/1994 | Heller et al. |
| 5,447,822 A | 9/1995 | Hull et al. |
| 5,484,314 A | 1/1996 | Farnworth .......... 445/24 |

(List continued on next page.)

Primary Examiner—Alexander Ghyka
(74) Attorney, Agent, or Firm—TraskBritt

(57) ABSTRACT

A stereolithographic method of applying material to preformed electronic components with a high degree of precision, and resulting structures. A substrate used for effecting electrical testing of semiconductor dice or a carrier substrate for same may be provided with a protective structure in the form of at least one layer or segment of dielectric material having a controlled thickness or depth. The layer or segment may include precisely sized, shaped and located apertures through which conductive terminals on the surface of the substrate may be accessed. Dielectric material may also be employed as a structure to mechanically align the die with the substrate for proper communication of conductive connective elements projecting from a die with the substrate terminals, either in the form of the apertures in the dielectric material layer or segment on the substrate to partially receive the conductive connective elements, an alignment structure comprising upwardly-projecting alignment elements adjacent or bracketing an intended die location on the substrate, or both.

37 Claims, 5 Drawing Sheets

U.S. PATENT DOCUMENTS

| | | |
|---|---|---|
| 5,495,328 A | 2/1996 | Spence et al. |
| 5,501,824 A | 3/1996 | Almquist et al. |
| 5,545,367 A * | 8/1996 | Bae et al. .................. 264/401 |
| 5,641,391 A * | 6/1997 | Hunter et al. ................ 205/80 |
| 5,693,144 A | 12/1997 | Jacobs et al. |
| 5,695,707 A | 12/1997 | Almquist et al. |
| 5,705,117 A | 1/1998 | O'Connor et al. |
| 5,776,409 A | 7/1998 | Almquist et al. |
| 5,779,967 A * | 7/1998 | Hull .......................... 264/401 |
| 5,840,239 A | 11/1998 | Partanen et al. |
| 5,855,718 A | 1/1999 | Nguyen et al. |
| 5,855,836 A | 1/1999 | Leyden et al. |
| 5,897,825 A | 4/1999 | Fruth et al. |
| 5,902,537 A | 5/1999 | Almquist et al. |
| 5,902,538 A | 5/1999 | Kruger et al. |
| 5,904,889 A | 5/1999 | Serbin et al. |
| 5,943,235 A | 8/1999 | Earl et al. |
| 5,945,058 A | 8/1999 | Manners et al. |

* cited by examiner

STEREOLITHOGRAPHIC METHOD FOR APPLYING MATERIALS TO ELECTRONIC COMPONENT SUBSTRATES AND RESULTING STRUCTURES

BACKGROUND OF THE INVENTION

1. Field of the Invention

The present invention relates generally to stereolithography and, more specifically, to the use of stereolithography in the application of materials to substrates of electronic components and the resulting structures.

2. State of the Art

In the past decade, a manufacturing technique termed "stereolithography", also known as "layered manufacturing", has evolved to a degree where it is employed in many industries.

Essentially, stereolithography as conventionally practiced, involves utilizing a computer to generate a three-dimensional (3-D) mathematical simulation or model of an object to be fabricated, such generation usually effected with 3-D computer-aided design (CAD) software. The model or simulation is mathematically separated or "sliced" into a large number of relatively thin, parallel, usually vertically superimposed layers, each layer having defined boundaries and other features associated with the model (and thus the actual object to be fabricated) at the level of that layer within the exterior boundaries of the object. A complete assembly or stack of all of the layers defines the entire object, and surface resolution of the object is, in part, dependent upon the thickness of the layers.

The mathematical simulation or model is then employed to generate an actual object by building the object, layer by superimposed layer. A wide variety of approaches to stereolithography by different companies has resulted in techniques for fabrication of objects from both metallic and non-metallic materials. Regardless of the material employed to fabricate an object, stereolithographic techniques usually involve disposition of a layer of unconsolidated or unfixed material corresponding to each layer within the object boundaries, followed by selective consolidation or fixation of the material to at least a semi-solid state in those areas of a given layer corresponding to portions of the object, the consolidated or fixed material also at that time being substantially concurrently bonded to a lower layer. The unconsolidated material employed to build an object may be supplied in particulate or liquid form, and the material itself may be consolidated, fixed or cured, or a separate binder material may be employed to bond material particles to one another and to those of a previously formed layer. In some instances, thin sheets of material may be superimposed to build an object, each sheet being fixed to a next lower sheet and unwanted portions of each sheet removed, a stack of such sheets defining the completed object. When particulate materials are employed, resolution of object surfaces is highly dependent upon particle size, whereas when a liquid is employed, resolution is highly dependent upon the minimum surface area of the liquid which can be fixed (cured) and the minimum thickness of a layer which can be generated, given the viscosity of the liquid and other parameters such as transparency to radiation or particle bombardment (see below) used to effect at least a partial cure of the liquid to a structurally stable state. Of course, in either case, resolution and accuracy of object reproduction from the CAD file is also dependent upon the ability of the apparatus used to fix the material to precisely track the mathematical instructions indicating solid areas and boundaries for each layer of material. Toward that end, and depending upon the layer being fixed, various fixation approaches have been employed, including particle bombardment (electron beams), disposing a binder or other fixative (such as by ink-jet printing techniques), or irradiation using heat or specific wavelength ranges.

An early application of stereolithography was to enable rapid fabrication of molds and prototypes of objects from CAD files. Thus, either male or female forms on which mold material might be disposed might be rapidly generated. Prototypes of objects might be built to verify the accuracy of the CAD file defining the object and to detect any design deficiencies and possible fabrication problems before a design was committed to large-scale production.

In more recent years, stereolithography has been employed to develop and refine object designs in relatively inexpensive materials, and has also been used to fabricate small quantities of objects where the cost of conventional fabrication techniques is prohibitive for same, such as in the case of plastic objects conventionally formed by injection molding. It is also known to employ stereolithography in the custom fabrication of products generally built in small quantities or where a product design is rendered only once. Finally, it has been appreciated in some industries that stereolithography provides a capability to fabricate products, such as those including closed interior chambers or convoluted passageways, which cannot be fabricated satisfactorily using conventional manufacturing techniques.

To the inventor's knowledge, stereolithography has yet to be applied to mass production of articles in volumes of thousands or millions, or employed to produce, augment or enhance products including other, pre-existing components in large quantities, where minute component sizes are involved, and where extremely high resolution and a high degree of reproducibility of results is required.

BRIEF SUMMARY OF THE INVENTION

The present invention provides a method of applying material to a preformed electronic component with a high degree of precision. For example, a substrate used for effecting electrical testing of semiconductor devices or to connect same to each other or to higher level packaging may be provided with a protective structure in the form of a layer of dielectric material having a controlled thickness or depth and defining precisely sized, shaped and located apertures through which conductive terminals on the surface of the substrate may be accessed for testing of a semiconductor die disposed on the substrate.

The dielectric layer, in addition to physically protecting, sealing and isolating circuit traces on the substrate from connective elements on the superimposed semiconductor die to prevent shorting, may be employed as desired as a structure to mechanically align the die with the substrate for proper communication of the connective elements with the substrate terminals. This may be effected in the context of a so-called "flip chip" semiconductor die bearing a pattern of connective elements projecting from the active surface of the die (such as solder bumps or conductive or conductor-bearing polymers) by using precisely sized and located apertures in the dielectric material to partially receive the connective elements. In addition to, or in lieu of, such an alignment structure approach, upwardly projecting alignment elements comprising the same material as that of the dielectric layer may be fabricated on the dielectric layer. Such alignment elements may, for example, comprise C-shaped projections located on opposing sides of an intended location for the semiconductor die, L-shaped projections at comers of the intended die location, or linear segments parallel to, and defining a slightly larger area than, the side of a rectangular die.

The present invention employs computer-controlled, 3-D CAD initiated, stereolithographic techniques to apply protective and alignment structures to a substrate. A dielectric layer or layer segments as well as alignment elements for a single die may be formed on a single substrate, or substantially simultaneously on a larger number of substrates. Likewise, such structures for a plurality of die locations may be defined on a larger substrate, as in the case of a "multi-chip module" or test substrate for multiple dice. Further, a large plurality of protective and alignment structures, each defining an intended die location, may be fabricated on a larger substrate structure and subsequently singulated for use as single-die substrates or multi-die substrates. Precise mechanical alignment of substrates or larger substrate structures on which dielectric layers or alignment elements are to be disposed may be effected by stereolithographically fabricating support and alignment elements or fixtures for the substrates or other structures on which protective or alignment structures are to be formed from the same or a different material, under control of the same 3-D CAD program. The substrates or larger substrate structures are then placed in the fixtures and a layer or layers of additional material formed thereon.

In a preferred embodiment, the protective and alignment structures formed on a substrate are fabricated using precisely focused electromagnetic radiation in the form of an ultraviolet (UV) wavelength laser to fix or cure a liquid material in the form of a photopolymer. However, the invention is not so limited, and other stereolithographically applicable materials may be employed in the present invention.

DETAILED DESCRIPTION OF THE INVENTION

Figure 1:
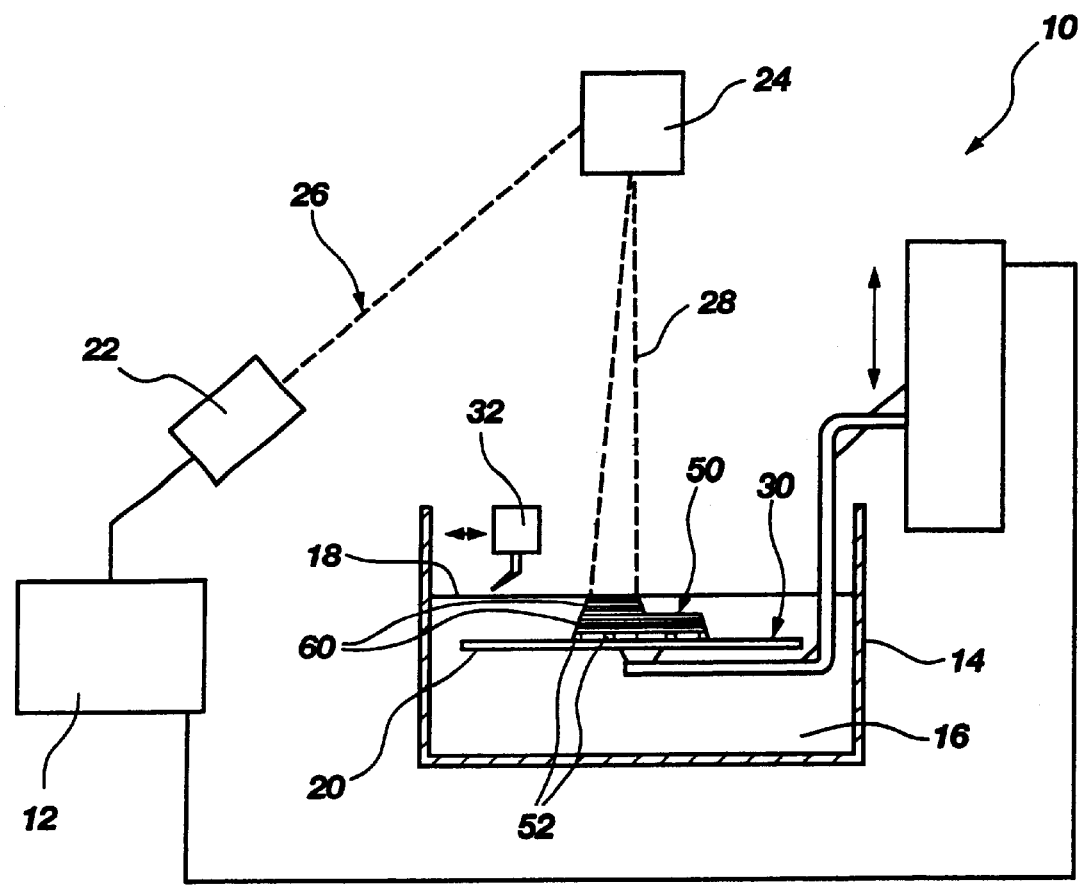
FIG. 1 is a schematic side elevation of an exemplary stereolithography apparatus suitable for use in practicing the method of the present invention.

FIG. 1 depicts schematically various components, and operation, of an exemplary stereolithography apparatus 10 to facilitate the reader's understanding of the technology employed in implementation of the present invention, although those of ordinary skill in the art will understand and appreciate that apparatus of other designs. and manufacture may be employed in practicing the method of the present invention. The preferred stereolithography apparatus for implementation of the present invention as well as operation of such apparatus are described in great detail in United States Patents assigned to 3D Systems, Inc. of Valencia, Calif., such patents including, without limitation, U.S. Pat. Nos. 4,575,330; 4,929,402; 4,996,010; 4,999,143; 5,015,424; 5,058,988; 5,059,021; 5,096,530; 5,104,592; 5,123,734; 5,130,064; 5,133,987; 5,141,680; 5,143,663; 5,164,128; 5,174,931; 5,174,943; 5,182,055; 5,182,056; 5,182,715; 5,184,307; 5,192,469; 5,192,559; 5,209,878; 5,234,636; 5,236,637; 5,238,639; 5,248,456; 5,256,340; 5,258,146; 5,267,013; 5,273,691; 5,321,622; 5,344,298; 5,345,391; 5,358,673; 5,447,822; 5,481,470; 5,495,328; 5,501,824; 5,554,336; 5,556,590; 5,569,349; 5,569,431; 5,571,471; 5,573,722; 5,609,812; 5,609,813; 5,610,824; 5,630,981; 5,637,169; 5,651,934; 5,667,820; 5,672,312; 5,676,904; 5,688,464; 5,693,144; 5,695,707; 5,711,911; 5,776,409; 5,779,967; 5,814,265; 5,840,239; 5,854,748; 5,855,718; and 5,855,836. The disclosure of each of the foregoing patents is hereby incorporated herein by this reference.

With reference again to FIG. 1 and as noted above, a 3-D CAD drawing of an object to be fabricated in the form of a data file is placed in the memory of a computer 12 controlling the operation of apparatus 10 if computer 12 is not a CAD computer in which the original object design is effected. In other words, an object design may be effected in a first computer in an engineering or research facility and the data files transferred via wide or local area network, tape, disc, CD-ROM or otherwise as known in the art to computer 12 of apparatus 10 for object fabrication.

The data is preferably formatted in an STL (for StereoLithography) file, STL being a standardized format employed by a majority of manufacturers of stereolithography equipment. Fortunately, the format has been adopted for use in many solid-modeling CAD programs, so often translation from another internal geometric database format is unnecessary. In an STL file, the boundary surfaces of an object are defined as a mesh of interconnected triangles.

Apparatus 10 also includes a reservoir 14 (which may comprise a removable reservoir interchangeable with others containing different materials) of liquid material 16 to be employed in fabricating the intended object. In the currently preferred embodiment, the liquid is a photo-curable polymer responsive to light in the UV wavelength range. The surface level 18 of the liquid material 16 is automatically maintained at an extremely precise, constant magnitude by devices known in the art responsive to the output of sensors within the apparatus and preferably under control of computer 12. A support platform or elevator 20, precisely vertically movable in fine, repeatable increments responsive to control of computer 12, is located for movement downward into and upward out of liquid material 16 in reservoir 14. A UV wavelength range laser plus associated optics and galvanometers (collectively identified as 22) for controlling the scan of laser beam 26 in the X-Y plane across platform 20 has associated therewith mirror 24 to reflect beam 26 downwardly as beam 28 toward surface 30 of platform 20. Beam 28 is traversed in a selected pattern in the X-Y plane, that is to say, in a plane parallel to surface 30, by initiation of the galvanometers under control of computer 12 to at least partially cure, by impingement thereon, selected portions of liquid material 16 disposed over surface 30 to at least a semi-solid state. The use of mirror 24 lengthens the path of the laser beam, effectively doubling same, and provides a more vertical beam 28 than would be possible if the laser 22 itself were mounted directly above platform surface 30, thus enhancing resolution.

Data from the STL files resident in computer 12 is manipulated to build an object 50 one layer at a time. Accordingly, the data mathematically representing object 50 is divided into subsets, each subset representing a slice or layer of object 50. This is effected by mathematically sectioning the 3-D CAD model into a plurality of horizontal layers, a "stack" of such layers representing object 50. Each slice or layer may be from about 0.0001 to 0.0300 inch thick. As mentioned previously, a thinner slice promotes higher resolution by enabling better reproduction of fine vertical surface features of object 50. In some instances, a base support or supports 52 for an object 50 may also be programmed as a separate STL file, such supports 52 being fabricated before the overlying object 50 in the same manner, and facilitating fabrication of an object 50 with reference to a perfectly horizontal plane and removal of object 50 from surface 30 of elevator 20. Where a "recoater" blade 32 is employed as described below, the interposition of base supports 52 precludes inadvertent contact of blade 32 with surface 30.

Before fabrication of object 50 is initiated with apparatus 10, the primary STL file for object 50 and the file for base support(s) 52 are merged. It should be recognized that, while reference has been made to a single object 50, multiple objects may be concurrently fabricated on surface 30 of platform 20. In such an instance, the STL files for the various objects and supports, if any, are merged. Operational parameters for apparatus 10 are then set, for example, to adjust the size (diameter, if circular) of the laser light beam used to cure material 16.

Before initiation of a first layer for a support 52 or object 50 is commenced, computer 12 automatically checks and, if necessary, adjusts by means known in the art the surface level 18 of liquid material 16 in reservoir 14 to maintain same at an appropriate focal length for laser beam 28. U.S. Pat. No. 5,174,931, referenced above and previously incorporated herein by this reference, discloses one suitable level control system. Alternatively, the height of mirror 24 may be adjusted responsive to a detected surface level 18 to cause the focal point of laser beam 28 to be located precisely at the surface of liquid material 16 at surface level 18 if level 18 is permitted to vary, although this approach is somewhat more complex. The platform 20 may then be submerged in liquid material 16 in reservoir 14 to a depth equal to the thickness of one layer or slice of the object 50, and the liquid surface level 18 readjusted as required to accommodate liquid material 16 displaced by submergence of platform 20. Laser 22 is then activated so that laser beam 28 will scan liquid material 16 over surface 30 of platform 20 to at least partially cure (e.g., at least partially polymerize) liquid material 16 at selective locations, defining the boundaries of a first layer 60 (of object 50 or support 52, as the case may be) and filling in solid portions thereof. Platform 20 is then lowered by a distance equal to the thickness of a layer 60, and the laser beam 28 scanned to define and fill in the second layer 60 while simultaneously bonding the second layer to the first. The process is then repeated, layer by layer, until object 50 is completed.

If a recoater blade 32 is employed, the process sequence is somewhat different. In this instance, the surface 30 of platform 20 is lowered into liquid material 16 below surface level 18, then raised thereabove until it is precisely one layer's thickness below blade 32. Blade 32 then sweeps horizontally over surface 30, or (to save time) at least over a portion thereof on which object 50 is to be fabricated, to remove excess liquid material 16 and leave a film thereof of the precise, desired thickness on surface 30. Platform 20 is then lowered so that the surface of the film and material level 18 are coplanar and the surface of the material 16 is still. Laser 22 is then initiated to scan with laser beam 28 and define the first layer 60. The process is repeated, layer by layer, to define each succeeding layer 60 and simultaneously bond same to the next lower layer 60 until object 50 is completed. A more detailed discussion of this sequence and apparatus for performing same is disclosed in U.S. Pat. No. 5,174,931, previously incorporated herein by reference.

As an alternative to the above approach to preparing a layer of liquid material 16 for scanning with laser beam 28, a layer of liquid material 16 may be formed on surface 30 by lowering platform 20 to flood material over surface 30 or over the highest completed layer 60 of object 50, then raising platform 20 and horizontally traversing a so-called "meniscus" blade across the platform (or just the formed portion of object 50) one layer thickness thereabove, followed by initiation of laser 22 and scanning of beam 28 to define the next higher layer 60.

Another alternative to layer preparation of liquid material 16 is to merely lower platform 20 to a depth equal to that of a layer of liquid material 16 to be scanned and then traverse a combination flood bar and meniscus bar assembly horizontally over platform 20 to substantially concurrently flood liquid material 16 over platform 20 and define a precise layer thickness of liquid material 16 for scanning.

All of the foregoing approaches to flooding and layer definition and apparatus of initiation thereof are known in the art, so no further details relating thereto will be provided.

Each layer 60 of object 50 is preferably built by first defining any internal and external object boundaries of that layer with laser beam 28, then hatching solid areas of object 50 with laser beam 28. If a particular part of a particular layer 60 is to form a boundary of a void in the object above or below that layer 60, then the laser beam 28 is scanned in a series of closely-spaced, parallel vectors so as to develop a continuous surface, or skin, with improved strength and resolution. The time it takes to form each layer 60 depends upon its geometry, surface tension and viscosity of material 16, and thickness of the layer.

Once object 50 is completed, platform 20 is elevated above surface level 18 of liquid material 16, and the platform 20 with object 50 may be removed from apparatus 10. Excess, uncured liquid material 16 on the surface of object 50 may be manually removed, and object 50 then solvent-cleaned and removed from platform 20, usually by cutting it free of base supports 52. Object 50 may then require postcuring, as material 16 may be only partially polymerized and exhibit only a portion (typically 40% to 60%) of its fully cured strength. Postcuring to completely harden object 50 may be effected in another apparatus projecting UV radiation in a continuous manner over object 50 and/or by thermal completion of the initial, UV-initiated partial cure.

In practicing the present invention, a commercially available stereolithography apparatus operating generally in the manner as that described with respect to apparatus 10 of FIG. 1 is preferably employed. For example and not by way of limitation, the SLA-250/50HR, SLA-5000 and SLA-7000 stereolithography systems, each offered by 3D Systems, Inc. of Valencia, Calif., are suitable for practice of the present invention. Photopolymers believed to be suitable for use in practicing the present invention include Cibatool SL 5170 and SL 5210 resins for the SLA-250/50HR system, Cibatool SL 5530 resin for the SLA-5000 and Cibatool SL 7510 resin for the SLA-7000 system. All of these resins are available from Ciba Specialty Chemicals Corporation. Materials are selected for dielectric constant, purity (semiconductor grade), and a coefficient of thermal expansion (CTE) sufficiently similar to that of the substrate to which the material is applied so that the substrate and cured material are not unduly stressed during thermal cycling in testing and subsequent normal operation. By way of example and not limitation, the layer thickness of material 16 to be formed, for purposes of the invention, may be on the order of 0.001 to 0.020 inch, with a high degree of uniformity over a field on a surface 30 of a platform 20. It should be noted that different material layers may be of different heights, so as to form a structure of a precise, intended total height or to provide different material thicknesses for different portions of a structure. The size of the laser beam "spot" impinging on the surface of liquid material 16 to cure same may be on the order of 0.002 inch to 0.008 inch. Resolution is preferably ±0.0003 inch in the X-Y plane (parallel to surface 30) over at least a 0.5 inch×0.25 inch field from a center point, permitting a high resolution scan effectively across a 1.0 inch×0.5 inch area. Of course, it is desirable to have substantially this high a resolution across the entirety of surface 30 of platform 20 to be scanned by laser beam 28, such area being termed the "field of exposure". The longer and more effectively vertical the path of laser beam 26/28, the greater the achievable resolution.

Figure 2:
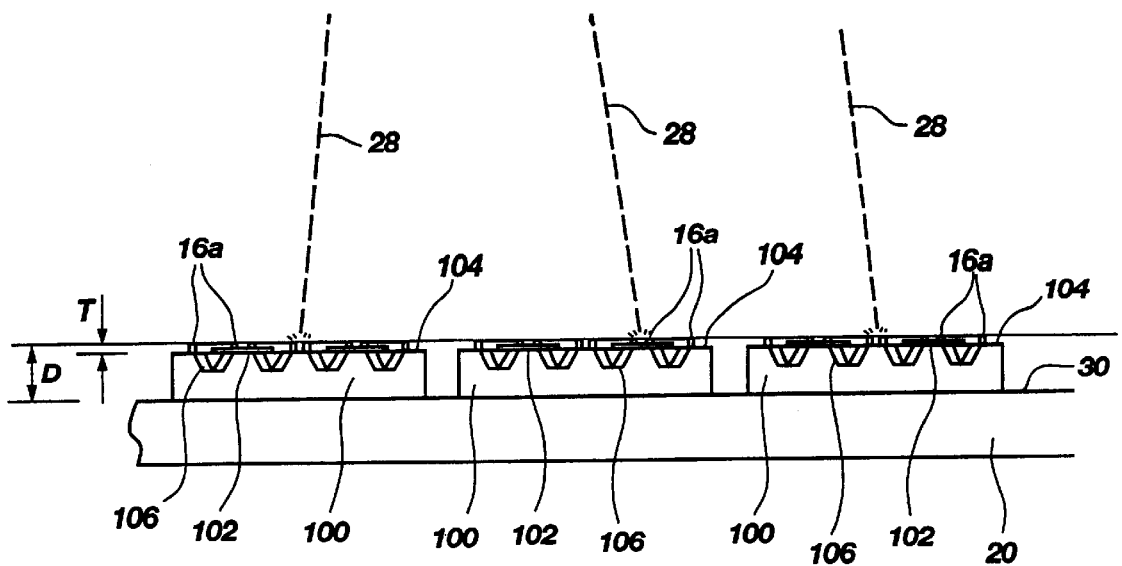
FIG. 2 is an enlarged, schematic side elevation of a plurality of electronic component substrates having at least one dielectric layer formed thereon according to the invention.
Figure 2A:
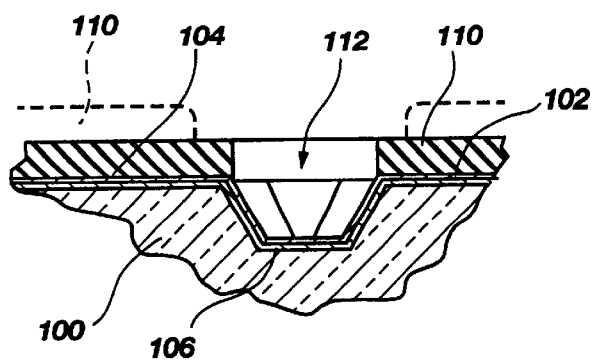
FIG. 2A is an enlarged, schematic side sectional elevation of a portion of an electronic component substrate of FIG. 2 having a dielectric layer formed thereon according to the invention.
Figure 3A:
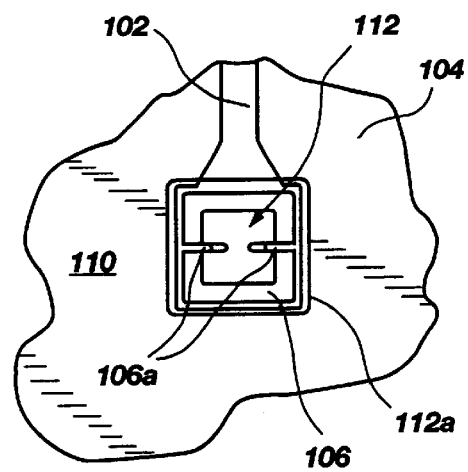
FIGS. 3A and 3B are enlarged, schematic top elevations of an electronic component substrate bearing circuit traces and recessed terminals of different configurations, each substrate having a dielectric layer formed thereon according to the invention.
Figure 3B:
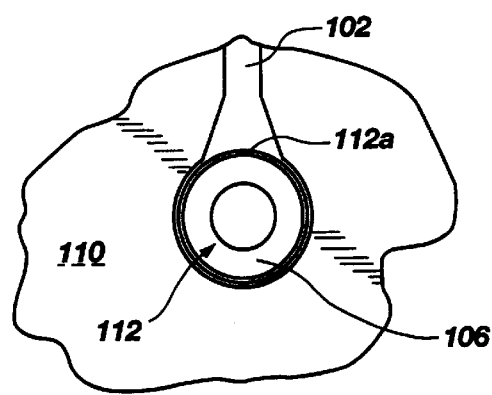
Figure 4:
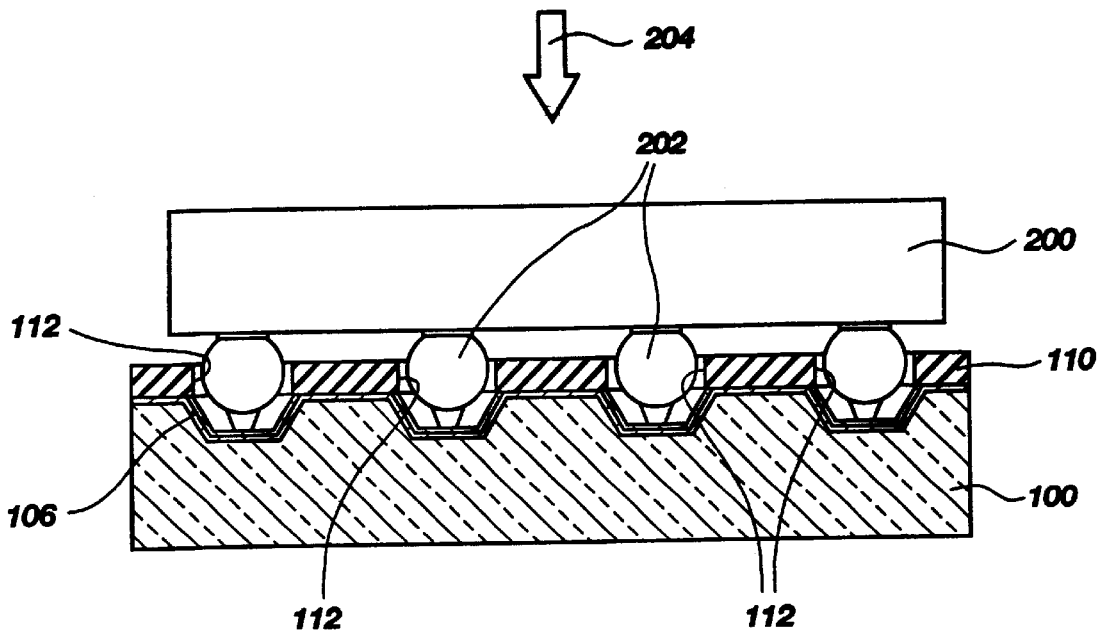
FIG. 4 is a side elevation of a substrate of FIG. 2 having a flip-chip configured die disposed thereon.

Referring to FIGS. 2 through 4 of the drawings, it will be apparent to the reader that the present invention involves a substantial departure from prior applications of stereolithography, in that preformed electrical components are modified by forming structures thereon using computer-controlled stereolithography. FIG. 2 depicts a plurality of electronic components in the form of substrates 100, also termed carrier substrates herein, having conductive traces 102 on the upper surfaces 104 thereof, traces 102 terminating in recessed terminals 106. The plurality of substrates 100 is disposed on surface 30 of a platform 20. The surface 30 of platform 20 is then submerged within liquid material 16 to a depth D equal to a desired layer thickness T on surfaces 104. Liquid material 16 is preferably selected for, among other parameters noted above, purity, dielectric constant and a coefficient of thermal expansion (CTE) similar to that of substrate 100, which may comprise silicon. A laser beam 28 is then scanned over substrates 100 to form one or more dielectric layers 110 thereover by curing liquid material 16 on the upper surface 104 of substrates 100, apertures 112 being defined in dielectric layer(s) 110 over terminals 106 using the path of laser beam 28 to circumscribe boundaries of cured material 16a about each terminal 106. Of course, if a recoater blade is employed, as described with respect to FIG. 1, the substrates 100 are lowered into liquid material 16 to cover same, raised above surface level 18 to a single layer's thickness below the lowermost edge of the blade, the blade horizontally traversed, and laser beam 28 initiated. A single layer 110 may be employed, or a plurality of layers 110 as shown in FIG. 2A formed in superimposition to provide greater insulation and physical protection for traces 102 and develop deeper apertures 112 with stepped openings as shown, if desired. As noted above, a single layer 110 may preferably be of about 0.004 inch in thickness, by way of example and not limitation, such dimension depending on the size of a conductive connective element (such as a solder ball) to be received therein. FIGS. 3A and 3B show portions of surfaces 104 of two different substrates 100 with a completed protective dielectric layer 110 (or series of layers 110) from above defining an terminal 112 above and substantially aligned with an underlying aperture 106, circuit traces 102 being shown in solid lines as dielectric layer(s) 110 may be optically transparent to ambient light. Terminal 106 may be substantially square as shown in FIG. 3A with blades 106a for penetrating the outer envelope of a solder ball without deformation of the ball as the ball is received in terminal 106, or may be of any other suitable shape, such as round (see FIG. 3B), depending upon the function (such as a temporary test connection versus a permanent connection) of terminal 106. As shown in FIG. 3A, the periphery 112a of aperture 112 may be "pulled back" a slight distance from the outer boundary of a terminal 106. Alternatively, as shown in FIG. 3B, periphery 112a of aperture 112 may extend inwardly over the outer boundary of a terminal 106. The high resolution achievable using stereolithography provides such flexibility and accuracy of boundary placement with relative ease.

As shown in FIG. 4, when a flip-chip configured semiconductor die 200 is disposed on substrate 100, projecting conductive connective elements 202 in the same precise pattern as terminals 106 are at least partially received in apertures 112 in dielectric layer(s) 110, which are located with substantially equal precision. Thus, apertures 112 serve to mechanically align a semiconductor die 200 for electrical connection to recessed terminals 106. If substrate 100 is a test substrate used for establishing semiconductor die 200 as a known good die, or KGD, such electrical connection may be established by merely mechanically compressing die 200 against substrate 100 as shown by arrow 204, such technique and test packages to effect same being known in the art. If a permanent electrical connection is desired and the projecting conductive connective elements 202 comprise tin/lead solder bumps as known in the art, the solder may be reflowed as known in the art to metallurgically bond to recessed terminals 106 formed of a solder-wettable material. If the projecting conductive connective elements 202 comprise a conductive epoxy or conductor-carrying epoxy, the epoxy may be cured to adhere to the surfaces of recessed terminals as known in the art. Of course, other materials as known in the art may be employed to form projecting conductive connective elements 202.

Figure 5:
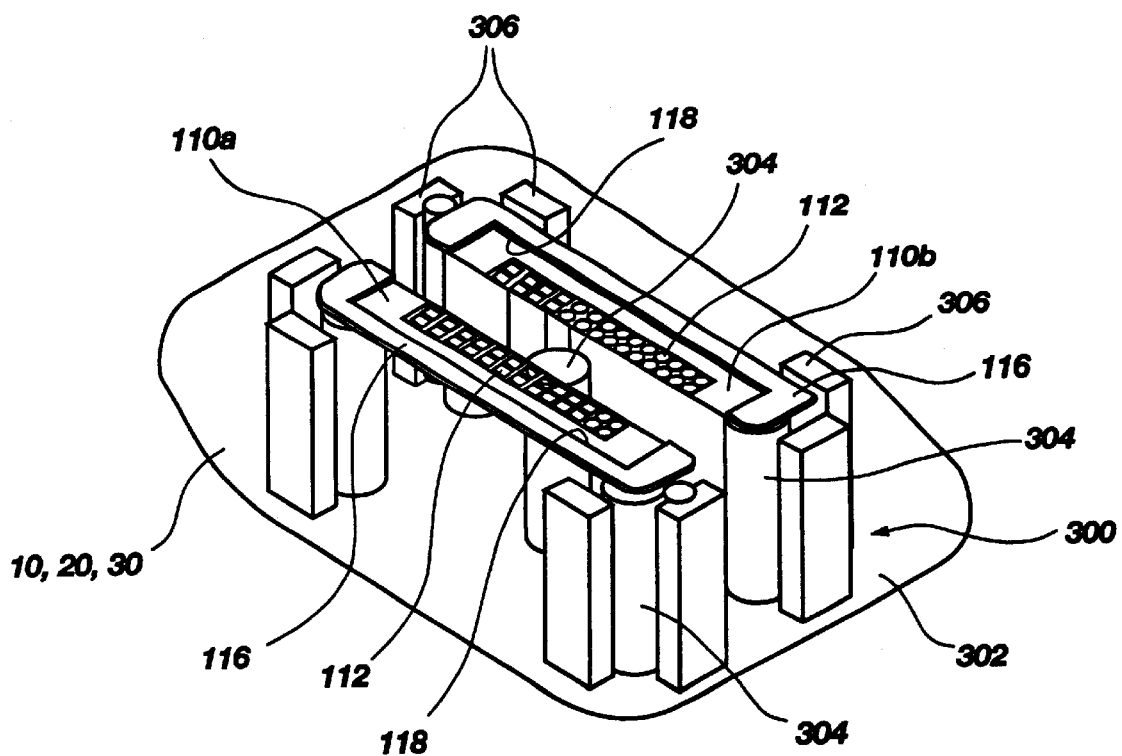
FIG. 5 is a perspective view of a substrate support and alignment structure and dielectric layer segments and alignment elements formed according to the present invention.
Figure 6:
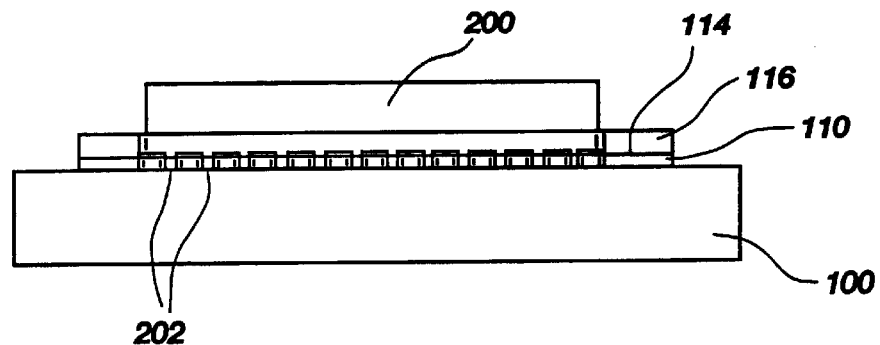
FIG. 6 is a schematic side elevation of a substrate having dielectric layer segments and alignment elements formed thereon according to the present invention and having a die disposed thereon.

In another embodiment of the invention, depicted in FIGS. 5 and 6, a substrate 100 is provided with a dielectric layer 110 thereover configured to circumscribe apertures 112 as in the prior embodiment. As shown in FIG. 5, layer 110 may be discontinuous and comprise layer segments 110a and 110b so as to only cover a portion of a substrate 100 with apertures 112 therethrough aligned with locations of recessed terminals 106 of substrate 100 (not shown for clarity) under layer segments 110a and 110b, the central portion of substrate 100 therebetween remaining completely uncovered. In addition to this stereolithographically-formed structure, at least one, and preferably a plurality of, upwardly projecting alignment elements 116 are formed on the upper surface 114 of uppermost dielectric layer 110 on substrate 100. Alignment elements 116 may be formed of the same liquid material 16 as dielectric layer 110, and may comprise only a single layer or multiple superimposed layers of cured material 16a. As best shown in FIG. 5, alignment elements 116 comprise generally C-shaped structures precisely formed just outboard of an area, shown at the inner boundaries 118 of alignment elements 116, defining the intended location of a semiconductor die 200 residing on substrate 100. Enough clearance may be provided within the boundaries of alignment elements 116 so that they provide rough alignment for a semiconductor die 200 to place projecting conductive connective elements 202 in at least partial alignment with apertures 112, at which point the projecting conductive connective elements 202 center themselves in apertures 112, completing the alignment process (see FIG. 6), which may be enhanced by vibrating substrate 100.

Figure 7:
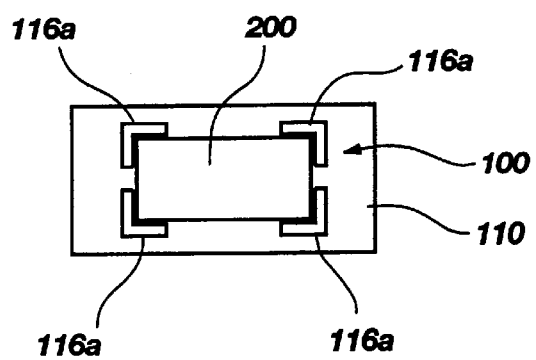
FIG. 7 is a schematic top view of a substrate having another embodiment of alignment elements according to the present invention formed thereon.

As shown in FIG. 7, a plurality of, or only one, L-shaped alignment element, designated as 116a, may be employed. If substrate 100 is slightly tilted toward the inner corner of a single alignment element 116a, a semiconductor die 200 thereon may be aligned with respect to substrate 100 responsive to vibration of the substrate 100. It should be noted that alignment elements 116, 116a may be employed independently of (i.e., without using) a dielectric layer 110 having apertures therethrough for alignment of a die 200 with respect to a substrate 100 to effect proper alignment of projecting conductive connective elements 202 of the die 200 with the terminals 106 of the substrate 100.

Figure 8:
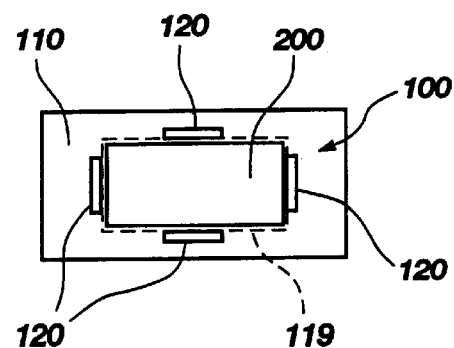
FIG. 8 is a schematic top view of a substrate having yet another embodiment of alignment elements according to the present invention formed thereon.

FIG. 8 depicts another arrangement of alignment elements 120, which comprise linear segments parallel to, and outboard of, the sides of a rectangle defining an intended location 119 of a semiconductor die 200 on a substrate 100.

Figure 9:
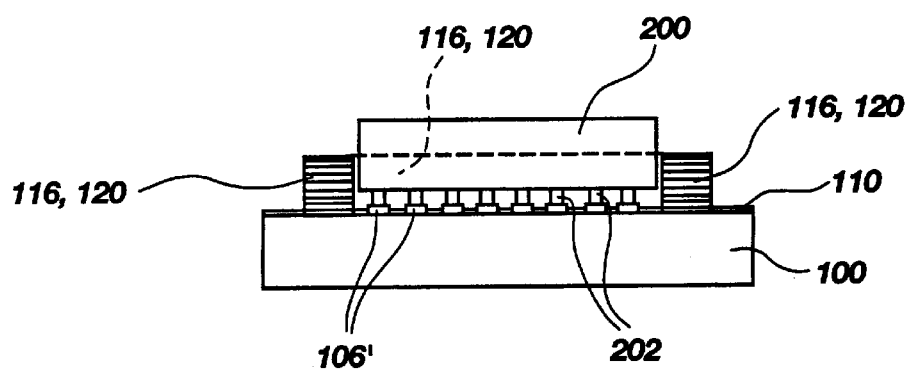
FIG. 9 is a schematic side elevation of a substrate configured with terminal pads and bearing an alignment structure formed thereon according to the present invention.

FIG. 9 depicts an arrangement wherein a substrate 100 is formed with flat terminal pads 106' instead of recessed terminals 106. In this instance, a single, extremely thin layer 110 of dielectric material too thin to assist in alignment of a die 200 may optionally be disposed over substrate 100, and upwardly projecting alignment elements 116 or 120 as shown employed for fine alignment of semiconductor die 200 to substrate 100 and specifically alignment of projecting conductive connective elements 202 to terminal pads 106' thereof. Of course, a thick layer 110 may be employed as described above to align conductive connective elements 202 even if terminal pads 106' are employed.

Figure 10:
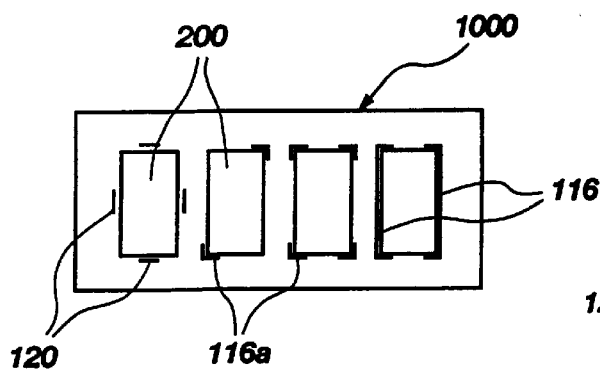
FIGS. 10 and 11 are, respectively, a schematic top elevation and a schematic side elevation of a substrate having alignment structures thereon according to the invention bearing multiple dice.
Figure 11:
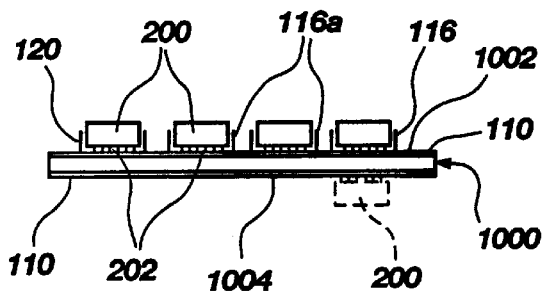

FIGS. 10 and 11 depict an arrangement wherein a plurality of semiconductor dice 200 is disposed on one or both sides 1002, 1004 of a larger carrier substrate 1000 such as might be used to fabricate a multi-chip module, including without limitation a SIMM, a DIMM or a TRIMM. All of the dice 200 are "bumped" in a flip-chip manner with projecting conductive connective elements 202, and substrate 1000 is stereolithographically overlaid with a layer or layers 110 of dielectric material, a plurality of die locations being defined by spaced arrays of apertures 112 (not shown). If required or desired, upwardly-projecting alignment elements such as 116, 120 may be formed on the exposed surface of uppermost dielectric layer 110 to facilitate die alignment of bumped dice 200 so that projecting conductive connective elements 202 may be received in apertures 112 (if deep and/or if recessed terminals 106 are employed, or a layer or layers 110 are used to define exceptionally deep apertures 112) or placed in superimposition to terminal pads 106' if such are employed and apertures 112 are of negligible depth.

Figure 12:
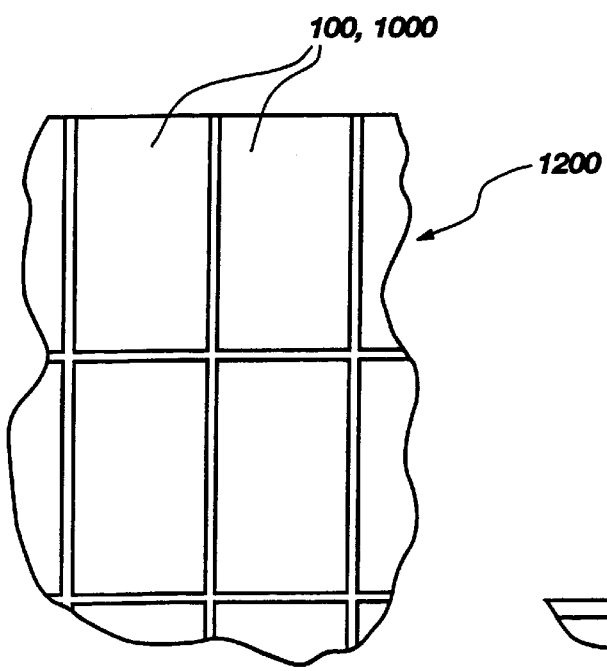
FIG. 12 is a schematic top elevation of a large substrate structure having a plurality of substrate locations defined thereon.

As shown in FIG. 12, a large plurality of silicon substrates 100 or 1000 may be formed on a wafer or other large-scale silicon structure 1200, such as a silicon-on-insulator (SOI) structure, including for example, a silicon-on-glass (SOG) structure or a silicon-on-sapphire (SOS) structure. Other large-scale substrate structures, such as ceramic structures or photo-imageable glass (for example, Foturan™ glass) from which substrates 100, or even 1000, may be formed with a high degree of precision and repeatability may be employed. Using this approach and a mechanical alignment system in apparatus 10 capable of the aforementioned resolution, a large number of substrates 100, 1000 may be covered with dielectric layer(s) 110 and, optionally, alignment elements such as 116 or 120 and the substrates 100 or 1000 subsequently singulated from the large-scale substrate structure 1200 as known in the art.

With respect to alignment of substrates 100, a larger carrier substrate 1000, or a large-scale substrate structure 1200 from which smaller substrates 100 or 1000 may be singulated, it is noteworthy that apparatus 10 may itself be used to form a substrate support and alignment structure from the same liquid material 16 as dielectric layers 110 or alignment structures 116 or 120. With specific reference to FIG. 5, a substrate support and alignment structure 300 may be programmed in an STL file for a specific substrate location 302 on surface 30 of a platform 20 of apparatus 10. Likewise, a plurality of central substrate supports 304 of pillar-like configuration and precise height may be precisely located proximate and within the perimeter of a substrate location 302, while a plurality of substrate alignment elements 306 of greater height than supports 304 may be precisely located immediately outboard of substrate location 302 so that a substrate 100 (not shown) disposed on supports 304 and within alignment elements 306 is exactly placed with the required degree of resolution for disposition of layer or layers 110 and, optionally, alignment elements 116 or 120 thereon. Of course, such a mechanical support and alignment structure may be differently configured, as desired, and accordingly programmed. Likewise, for positioning of larger substrates 1000 or a large-scale substrate structure 1200, a larger support structure with appropriate alignment elements may be designed and accordingly programmed for mechanical alignment purposes.

Figure 13:
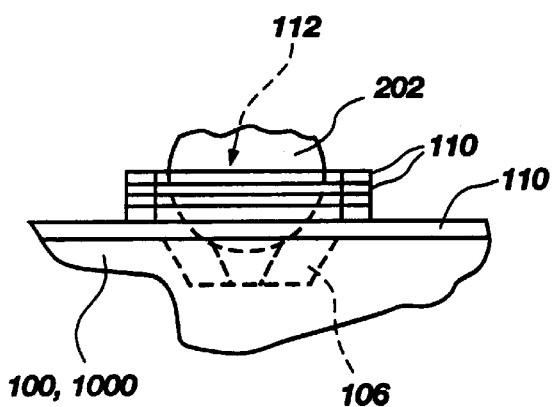
FIG. 13 is an enlarged side elevation of a collar formed according to the invention to define a deep aperture over a terminal on a substrate.

It should be re-emphasized that the stereolithographic technique of the present invention is suitable for covering, or leaving uncovered, any desired portion of a substrate such as 100 or 1000, so that trace ends for connection to test equipment or higher-level packaging may be left bare. Similarly, a thin base dielectric layer 110 may be disposed on a substrate 100 or 1000 and "collars" built up to a higher level by one or more additional layers 110 to deepen apertures 112 as shown in FIG. 13.

While the present invention has been disclosed in terms of certain preferred embodiments, those of ordinary skill in the art will recognize and appreciate that the invention is not so limited. Additions, deletions and modifications to the disclosed embodiments may be effected without departing from the scope of the invention as claimed herein. Similarly, features from one embodiment may be combined with those of another while remaining within the scope of the invention.

What is claimed is:

1. A method of fabricating an electronic component, comprising:

providing a substrate having a plurality of terminals on a surface thereof;

forming a first layer of material in a liquid state over at least a portion of the substrate surface including at least one terminal of the plurality; and selectively altering the liquid state of the first layer of material over the portion of the substrate surface to at least a semi-solid state while leaving material residing substantially above the at least one terminal in the liquid state.

2. The method of claim 1, further comprising forming the first layer of the material in a liquid state over at least a portion of the substrate surface including the plurality of terminals and selectively altering the liquid state of material surrounding the terminals of the plurality to at least the semi-solid state while leaving the material residing substantially above the terminals of the plurality in the liquid state.

3. The method of claim 2, further comprising forming the first layer of the material in a liquid state over an entire substrate surface and selectively altering the liquid state of the material over the entire substrate surface to at least the semi-solid state while leaving the material residing substantially above the terminals of the plurality in the liquid state.

4. The method of claim 1, further including adhering the material altered to at least the semi-solid state to the portion of the substrate surface.

5. The method of claim 4, wherein the adhering is effected substantially simultaneously with the selective state altering.

6. The method of claim 1, further including forming at least a second layer of the material in the liquid state over the first layer and selectively altering the liquid state of at least the second layer of material to at least the semi-solid state while leaving the material residing substantially above the at least one terminal in the liquid state.

7. The method of claim 6, further including adhering the material of the second layer altered to at least the semi-solid state to the material of the first layer so altered.

8. The method of claim 7, wherein the adhering is effected substantially simultaneously with the selective state altering.

9. The method of claim 1, further including selectively altering the liquid material state to at least the semi-solid state in spaced relationship to at least a periphery of the at least one terminal of the plurality.

10. The method of claim 1, further including selectively altering the liquid material state to at least the semi-solid state in overlapping relationship to at least a portion of a periphery of the at least one terminal of the plurality.

11. The method of claim 1, further including altering the semi-solid state material to a solid state.

12. The method of claim 1, further including removing the liquid-state material from substantially above the at least one terminal after the selective state altering.

13. A method of fabricating electronic components, comprising:

providing a plurality of substrates, each bearing a plurality of terminals on a surface thereof;

forming a first layer of material in a liquid state over each of the terminal-bearing substrate surfaces; and selectively altering the liquid state of the first layers of material to at least a semi-solid state while leaving material residing substantially above the plurality of terminals in the liquid state.

14. The method of claim 13, further including adhering the material altered to at least the semi-solid state to the substrate surfaces.

15. The method of claim 14, wherein the adhering is effected substantially simultaneously with the selective state altering.

16. The method of claim 13, further including forming at least second layers of the material in the liquid state over the first layers and selectively altering the liquid state of at least the second layers of the material to at least the semi-solid state while leaving the material residing substantially above the plurality of terminals in the liquid state.

17. The method of claim 16, further including adhering the material of the second layers altered to at least the semi-solid state to the material of the first layers so altered.

18. The method of claim 17, wherein the adhering is effected substantially simultaneously with the selective state altering.

19. The method of claim 13, further including selectively altering the liquid material state to at least the semi-solid state in spaced relationship to at least a portion of peripheries of at least some of the plurality of terminals.

20. The method of claim 13, further including selectively altering the liquid material state to at least the semi-solid state in overlapping relationship to at least a portion of peripheries of at least some of the plurality of terminals.

21. The method of claim 13, further including altering the semi-solid state material to a solid state.

22. The method of claim 13, further including removing the liquid-state material from substantially above the plurality of terminals after the selective state altering.

23. A method of fabricating a carrier substrate for a semiconductor die, comprising:

providing a substrate bearing a plurality of terminals on a surface thereof, the terminals having circuit traces extending therefrom along at least a portion of the substrate surface;

forming a first layer of material in a liquid state over the substrate surface; and selectively altering the liquid state of the first layer of material to at least a semi-solid state over at least portions of the circuit traces while leaving material residing substantially above the plurality of terminals in the liquid state to define a substantially continuous layer of the material in at least the semi-solid state extending over at least a portion of the substrate surface, said substantially continuous layer including apertures therethrough substantially over the plurality of terminals.

24. The method of claim 23, further including adhering the material altered to at least the semi-solid state to the substrate surface.

25. The method of claim 24, wherein the adhering is effected substantially simultaneously with the state altering.

26. The method of claim 23, further including forming at least a second layer of the material in the liquid state over the first layer of material and selectively altering the liquid state of at least the second layer of the material to at least a semi-solid state while leaving material residing substantially above the plurality of terminals in the liquid state.

27. The method of claim 26, further including adhering the material of at least the second layer altered to at least the semi-solid state to the material of the first layer so altered.

28. The method of claim 27, wherein the adhering is effected substantially simultaneously with the selective state altering.

29. The method of claim 23, further including selectively altering the liquid material state to at least the semi-solid state in spaced relationship to at least a portion of peripheries of at least some of the plurality of terminals.

30. The method of claim 23, further including selectively altering the liquid material state to at least the semi-solid state in overlapping relationship to at least a portion of peripheries of at least some of the plurality of terminals.

31. The method of claim 23, further including altering the semi-solid state material to a solid state.

32. The method of claim 23, further including removing the liquid-state material from substantially above the plurality of terminals after the selective state altering.

33. A method of fabricating a carrier substrate for a semiconductor die, comprising:

providing a substrate bearing a plurality of terminals on a surface thereof;

forming an alignment structure projecting above the substrate surface configured to promote positioning of the semiconductor die thereover with at least some conductive connective elements projecting from a surface of the semiconductor die aligned with at least some terminals of the plurality, wherein forming said alignment structure includes:

forming at least one layer of material in a liquid state over the substrate surface; and selectively altering the liquid state of the at least one layer of material to at least a semisolid state over at least portions of the substrate surface to define the alignment structure while leaving a remainder of the at least one layer of material in the liquid state.

34. The method of claim 33, wherein forming the alignment structure further includes selectively altering the liquid state of the at least one layer of material to at least the semi-solid state in regions proximate at least some of the terminals of the plurality while leaving material residing substantially above the at least some of the terminals in a liquid state to define apertures through the altered-state material sized and configured to receive at least portions of the projecting conductive connective elements of the semiconductor die.

35. The method of claim 34, wherein forming the alignment structure further includes selectively altering the liquid state of at least another layer of material to at least the semi-solid state to define at least one alignment element in at least one location over the substrate surface located proximate a periphery of a position of the semiconductor die with at least some conductive connective elements projecting from the surface of the semiconductor die aligned with at least some terminals of the plurality.

36. The method of claim 33, wherein forming the alignment structure further includes selectively altering the liquid state of the at least one layer of material to at least a semi-solid state to define at least one alignment element in at least one location over the substrate surface located proximate a periphery of a position of the semiconductor die with at least some projecting conductive connective elements of the semiconductor die aligned with at least some terminals of the plurality.

37. The method of claim 33, further comprising, prior to the forming of the alignment structure, forming at least another layer of material in the liquid state over the substrate surface, and selectively altering the liquid state of the at least another layer of material to at least a semi-solid, substantially continuous structure over at least a majority of the substrate surface while leaving material residing substantially above the plurality of terminals in the liquid state to define apertures therethrough sized and configured to at least partially receive at least portions of the projecting conductive connective elements of the semiconductor die.

* * * * *